(12) United States Patent  
Byon (10) Patent No.: US 8,183,916 B2  
(45) Date of Patent: May 22, 2012

(54) NON-INVERTING AMPLIFIER AND VOLTAGE SUPPLY CIRCUIT INCLUDING THE SAME

(75) Inventor: Sang-Woog Byon, Namyangju-si (KR)

(73) Assignee: Samsung Electronics Co., Ltd., Su-Won-Si (KR)

( * ) Notice: Subject to any disclaimer, the term of this patent is extended or adjusted under 35 U.S.C. 154(b) by 0 days.

(21) Appl. No.: 12/777,636

(22) Filed: May 11, 2010

(65) Prior Publication Data

US 2010/0301932 A1  Dec. 2, 2010

(30) Foreign Application Priority Data

Jun. 1, 2009  (KR) .................. 10-2009-0048211

(51) Int. Cl.  
*H03F 3/45* (2006.01)
(52) U.S. Cl. ............................. 330/69; 330/86
(58) Field of Classification Search .............. 330/9, 69, 330/86  
See application file for complete search history.

(56) References Cited

U.S. PATENT DOCUMENTS

| 6,259,300 | B1 * | 7/2001 | Yasuda et al. ................. 327/563 |
| 6,924,696 | B2 * | 8/2005 | Wentink ............................. 330/69 |
| 7,304,534 | B2 * | 12/2007 | Koller et al. ........................ 330/9 |
| 2004/0080365 | A1 * | 4/2004 | Wentink .......................... 330/69 |
| 2006/0145904 | A1 | 7/2006 | Kim |
| 2009/0167432 | A1 * | 7/2009 | van den Heuvel .............. 330/69 |

FOREIGN PATENT DOCUMENTS

| JP | 07066477 | 3/1995 |
| KR | 1020020070711 | 9/2002 |
| KR | 1020060080419 | 7/2006 |

* cited by examiner

*Primary Examiner* — Khanh Nguyen  
(74) *Attorney, Agent, or Firm* — F. Chau & Associates, LLC (57) ABSTRACT

A non-inverting amplifier includes an operational amplifier, an input resistor, and a feedback resistor. The operational amplifier amplifies and outputs a difference between an input voltage and a voltage of a control node. The input resistor is connected between a reference voltage port and the control node. The feedback resistor is connected to an output port of the operational amplifier and the control node. The non-inverting amplifier supplies a control current to the control node for controlling an offset voltage of the output port.

10 Claims, 6 Drawing Sheets

| Current (Ic) | SW1 | SW2 | SW2 | SW4 | Decoded Value |
|---|---|---|---|---|---|
| 0 | OFF | OFF | OFF | OFF | 0000 |
| i | ON | OFF | OFF | OFF | 1000 |
| 2i | OFF | ON | OFF | OFF | 0100 |
| 3i | ON | ON | OFF | OFF | 1100 |
| 4i | OFF | OFF | ON | OFF | 0010 |
| 5i | ON | OFF | ON | OFF | 1010 |
| 6i | OFF | ON | ON | OFF | 0110 |
| 7i | ON | ON | ON | OFF | 1110 |
| 8i | OFF | OFF | OFF | ON | 0001 |
| 9i | ON | OFF | OFF | ON | 1001 |
| 10i | OFF | ON | OFF | ON | 0101 |
| 11i | ON | ON | OFF | ON | 0011 |
| 12i | OFF | OFF | ON | ON | 0011 |
| 13i | ON | OFF | ON | ON | 1011 |
| 14i | OFF | ON | ON | ON | 0111 |
| 15i | ON | ON | ON | ON | 1111 |

NON-INVERTING AMPLIFIER AND VOLTAGE SUPPLY CIRCUIT INCLUDING THE SAME

CROSS-REFERENCE TO RELATED APPLICATION

This patent application claims under 35 U.S.C. §119 priority to and the benefit of Korean Patent Application No. 10-2009-0048211, filed on Jun. 1, 2009, the entire content of which is incorporated by reference herein.

BACKGROUND

1. Technical Field

The present disclosure relates to amplifiers, and, more particularly, to a non-inverting amplifier and a voltage supply circuit including the same.

2. Discussion of Related Art

Recently, with the increasing demand for video and audio systems, recording mediums that record and store high-quality video data and audio data for extended periods of time, for example, optical discs such as Digital Versatile Disc (DVD)-based DVD Recordable/Rewritable (DVD±R/RW) and DVD-Random Access Memories (RAMs), have been developed. However, since the storage capacities of DVDs may be gradually reaching their limitations, new high-density optical discs, such as the high-capacity Blue-ray Disc (BD) that can record/rewrite tens or more Gbyte, are being developed. In addition, other recording mediums such as Magnetic Optical Disc Drives (MODD) and CD-R/RWs are also being pursued.

For reading information stored in optical discs or writing information, various levels of laser power are needed depending upon the kind of optical disc and laser power digital-to-analog converters are used to adjust the laser power.

However, since the analog circuits typically cannot output a voltage of 0 V as the voltage of a final output port and provide linearity near a voltage of 0 V, it becomes difficult to finely adjust the laser power.

SUMMARY

In accordance with an exemplary embodiment of the present inventive concept a non-inverting amplifier is provided that can control an offset voltage, thereby enabling a voltage of substantially 0 V to be outputted.

In accordance with an exemplary embodiment a non-inverting amplifier includes an operational amplifier that amplifies and outputs a difference between an input voltage and a voltage of a control node. An input resistor is connected between a reference voltage port and the control node. A feedback resistor is connected to an output port of the operational amplifier and the control node. The non-inverting amplifier supplies a control current to the control node for controlling an offset voltage of the output port.

The input voltage may be transferred to the output port of the operational amplifier.

When the input voltage is substantially 0 V, a voltage of the output port of the operational amplifier may become substantially 0 V.

The non-inverting amplifier may further include a current digital-to-analog converter for supplying the control current to the control node.

The current digital-to-analog converter may include a plurality of current sources connectable in parallel. Each of the current sources may be configured to supply a current to the control node when a switching operation connects a respective current source to the control node.

Each of the current sources may be connected in series to a respective switch such that the switching operation controls each of the respective switches to supply a desired control current.

The switching operation may control each of the respective switches according to a decoded digital value.

The decoded digital value may include a sequence of digital bits, each digital bit being associated with an on-off condition of each of the respective switches.

The plurality of current sources connectable in parallel may include a first current source that provides a first current amount, a second current source that provides twice the first current amount, a third current source that provides four times the first current amount, and a fourth current source that provides eight times the first current amount.

In accordance with an exemplary embodiment a voltage supply circuit includes a digital-to-analog converter that generates an analog voltage according to a digital value. At least one non-inverting amplifier transfers an output voltage of the digital-to-analog converter. The at least one non-inverting amplifier includes an operational amplifier that amplifies and outputs a difference between an input voltage and a voltage of a control node, an input resistor connected between a reference voltage port and the control node, and a feedback resistor connected to an output port of the operational amplifier and the control node. The at least one non-inverting amplifier supplies a control current to the control node for controlling an offset voltage of the output port.

Two or more of the non-inverting amplifiers may each transfer the output voltage of the digital-to-analog converter and may each output substantially the same voltage.

The voltage supply circuit may be configured to supply at least one voltage to a laser diode driver that controls a laser diode in a laser power optical disc system.

According to an exemplary embodiment an apparatus is provided for controlling an offset voltage of an operational amplifier having a non-inverting input port, an inverting input port, an output port, a feedback resistor coupled between the output port and the non-inverting input port, and an input resistor coupled between the non-inverting port and a reference voltage port, when an input voltage applied to the non-inverting input port of the non-inverting amplifier is substantially 0 V. The apparatus includes a control node coupled to the non-inverting port and a plurality of current sources connectable in parallel. Each of the current sources is connected in series to a respective switch such that a switching operation controls each of the respective switches to supply a desired control current to the control node according to a decoded digital value comprising a sequence of digital bits, each digital bit being associated with an on-off condition of each of the respective switches.

Each of the plurality of current sources may be configured to provide a different current amount.

A first current source of the plurality of current sources may be configured to provide a current amount i, and the sequence of digital bits may be arrangeable to provide the desired control current in i incremental current amounts in the range of i to 15i.

BRIEF DESCRIPTION OF THE DRAWINGS

The accompanying drawings, together with the description, explain the exemplary embodiments of the inventive.

DETAILED DESCRIPTION OF THE EXEMPLARY EMBODIMENTS

A non-inverting amplifier according to exemplary embodiments of the inventive concept can be implemented to supply a control current to an input resistor or a feedback resistor for controlling an offset voltage, that is, a voltage that is outputted when the input voltage of the non-inverting amplifier is substantially 0 V. In a perfect amplifier, there would be no offset voltage. However, an offset voltage typically exists because of imperfections in the amplifier. Accordingly, the non-inverting amplifier according to the exemplary embodiments of the inventive concept is configured to control the offset voltage and to generate an output voltage of substantially 0 V.

Figure 1:
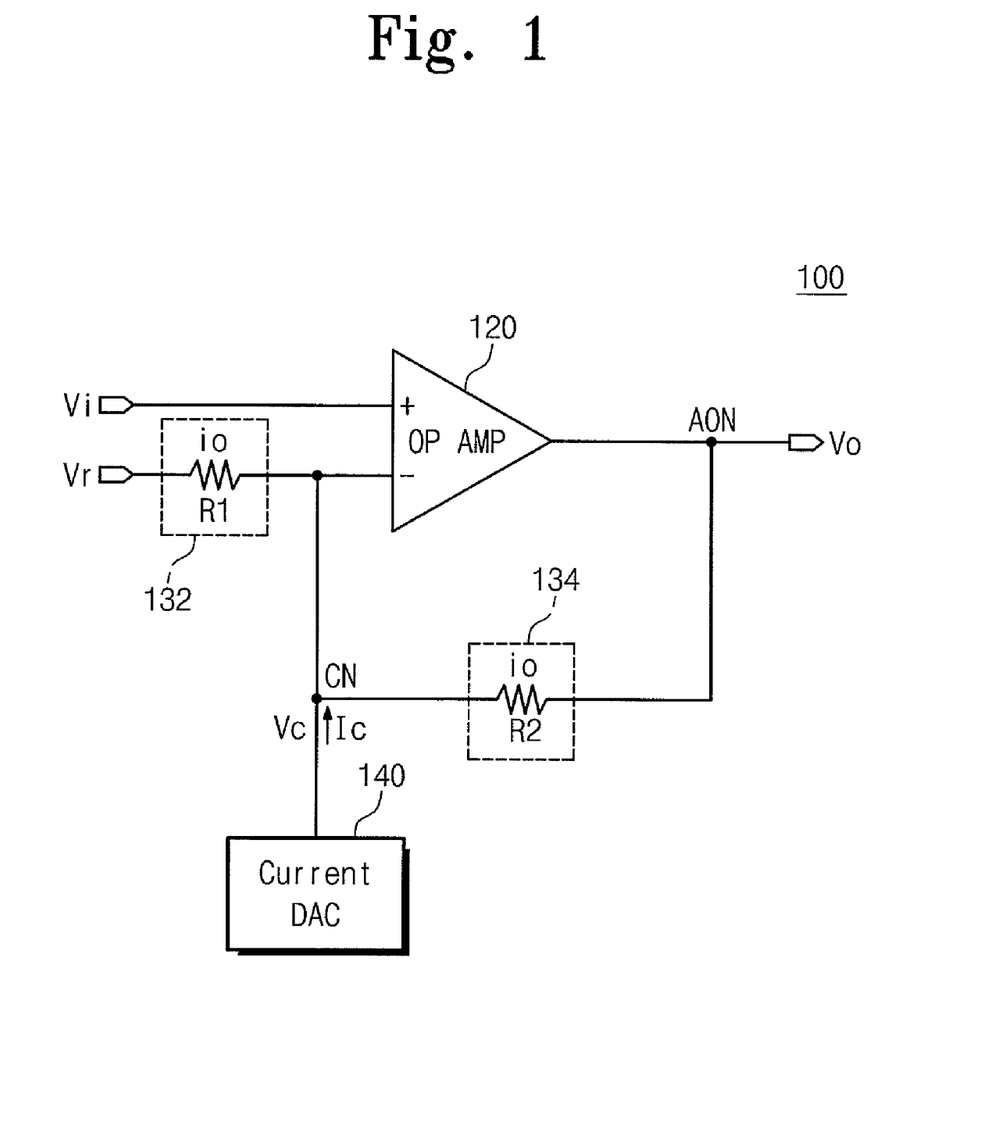
FIG. 1 is a diagram illustrating a non-inverting amplifier according to an exemplary embodiment of the inventive concept.

FIG. 1 is a diagram illustrating a non-inverting amplifier according to an exemplary embodiment of the inventive concept. A non-inverting amplifier 100 includes an operational amplifier 120, an input resistor 132, a feedback resistor 134, and a current digital-to-analog (D/A) converter 140. For controlling the offset voltage of the operational amplifier 120, the non-inverting amplifier 100 includes a current D/A converter 140 that supplies a control current Ic to a control node CN.

The operational amplifier 120 amplifies and outputs the difference between an input voltage Vi and the voltage Vc of the control node CN. That is, the input voltage Vi is inputted to the non-inverting input port of the operational amplifier 120, and a control voltage Vc is inputted to the inverting input port of the operational amplifier 120. The input impedance of the operational amplifier 120 is close to infinity, and output impedance of the operational amplifier 120 is close to 0.

The input resistor 132 is connected between a reference voltage Vr port and the control node CN. That is, the input resistor 132 is connected between the reference voltage Vr port and the inverting input port of the operational amplifier 120. The feedback resistor 134 is connected between the inverting input port of the operational amplifier 120 and an output node AON. That is, the feedback resistor 134 is connected between the control node CN and the output node AON. The input resistor 132 and the feedback resistor 134 are used to determine the amplification rate of the non-inverting amplifier 100. That is, the voltage gain "Vo/Vi" of the non-inverting amplifier 100 is "1+R2/R1".

The current D/A converter 140 controls the amount of current that flows in the input resistor 132 or the feedback resistor 134 for controlling the offset voltage of the operational amplifier 120. That is, the current D/A converter 140 provides the optimal control current Ic to the control node CN for controlling the offset voltage. The optimal control current Ic may be determined with a decoded value (digital value) and the decoded value may be determined by a user that implements the non-inverting amplifier 100.

In the non-inverting amplifier 100, the operation of controlling the offset voltage is as follows. The operation of controlling the offset voltage may be divided into the case in which the voltage of the control node CN is greater than the reference voltage Vr and the case in which the voltage of the control node CN is less than the reference voltage Vr. When the voltage of the control node CN is greater than the reference voltage Vr, the control current Ic flows to the input resistor 132. On the other hand, when the voltage of the control node CN is less than the reference voltage Vr, the control current Ic flows to the feedback resistor 134.

First, when the voltage Vc of the control node CN is greater than the reference voltage Vr, the offset voltage can be controlled as follows. The following description will first be made in the case in which the current Ic is not supplied by the current D/A converter 140. Since the input impedance of the operational amplifier 100 is close to infinity, current does not flow to an inverting input port. Accordingly, a current i0 that flows in the input resistor 132 and the feedback resistor 134 is expressed as Equation (1) below.

$$i_0 = \frac{Vo - Vr}{R1 + R2} \quad (1)$$

Then, since the voltage Vc of the control node CN is greater than the reference voltage Vr, the following Equation (2) is satisfied.

$$Vc - Vr = i_0 * R1 \quad (2)$$

Accordingly, an output voltage Vo is expressed as Equation (3) below.

$$Vo = (Vc - Vr)\frac{R1 + R2}{R1} + Vr \quad (3)$$

where, when the current Ic is supplied to the control node CN for controlling the offset voltage of the output node AON, the current Ic flows to the input resistor R1. This is because the voltage Vc of the control node CN is greater than the reference voltage Vr. Accordingly, the following Equation (4) is satisfied.

$$Vc - Vr = (i_0 + Ic) * R1 \quad (4)$$

where, if a voltage Vs1 is "Ic*R1", a final output voltage Vo is expressed as Equation (5) below.

$$Vo = (Vc - Vr - Vs_1)\frac{R1 + R2}{R1} + Vr \quad (5)$$

Accordingly, the output voltage Vo of the output node AON is controlled by the current Ic that is supplied to the control node CN. That is, in the non-inverting amplifier 100, the current Ic supplied to the control node CN is controlled, and thus the shift of the output voltage Vo may be performed. As such, the offset voltage of the operational amplifier 120 can be controlled.

Second, when the voltage Vc of the control node CN is less than the reference voltage Vr, the offset voltage may be controlled as follows. Since the input impedance of the operational amplifier 120 is close to infinity, a current does not flow to an inverting input port. Accordingly, the current i0 that flows in the input resistor 132 and the feedback resistor 134 is expressed as Equation (6) below.

$$i_0 = \frac{Vr - Vo}{R1 + R2} \quad (6)$$

Then, since the voltage Vc of the control node CN is less than the reference voltage Vr, the following Equation (7) is satisfied.

$$Vc - Vo = i_0 * R2 \quad (7)$$

Accordingly, the output voltage Vo is expressed as Equation (8) below.

$$Vo = Vc\frac{R1 + R2}{R2} - Vr\frac{R1}{R2} \quad (8)$$

where, when the current Ic is supplied to the control node CN for controlling the offset voltage of the output node AON, the current Ic flows to the feedback resistor 134. This is because the voltage Vc of the control node CN is less than the reference voltage Vr. Accordingly, the following Equation (9) is satisfied.

$$Vc - Vo = (i_0 + Ic) * R2 \quad (9)$$

where, if a voltage Vs2 is "Ic*R2", a final output voltage Vo is expressed as Equation (10) below.

$$Vo = Vc\frac{R1 + R2}{R1} - Vr\frac{R2}{R1} - Vs_2\frac{R1 + R2}{R1} \quad (10)$$

Accordingly, the output voltage Vo of the output node AON is controlled by the current Ic that is supplied to the control node CN. That is, in the non-inverting amplifier 100, the current Ic supplied to the control node CN is controlled, and thus the shift of the output voltage Vo may be performed.

As described above, the non-inverting amplifier 100 supplies an optimal current Ic to the control node CN for controlling the offset voltage. Particularly, when the input voltage Vi of substantially 0 V is inputted, the non-inverting amplifier 100 may perform controlling for the output voltage Vo to become substantially 0 V.

The non-inverting amplifier 100, as illustrated in FIG. 1, uses the current D/A converter 140 for supplying an optimal current Ic to the control node CN, but the non-inverting amplifier 100 is not limited thereto. The non-inverting amplifier 100 may include a current source that may supply an optimal current to the control node CN, for controlling the offset voltage.

Figure 2:
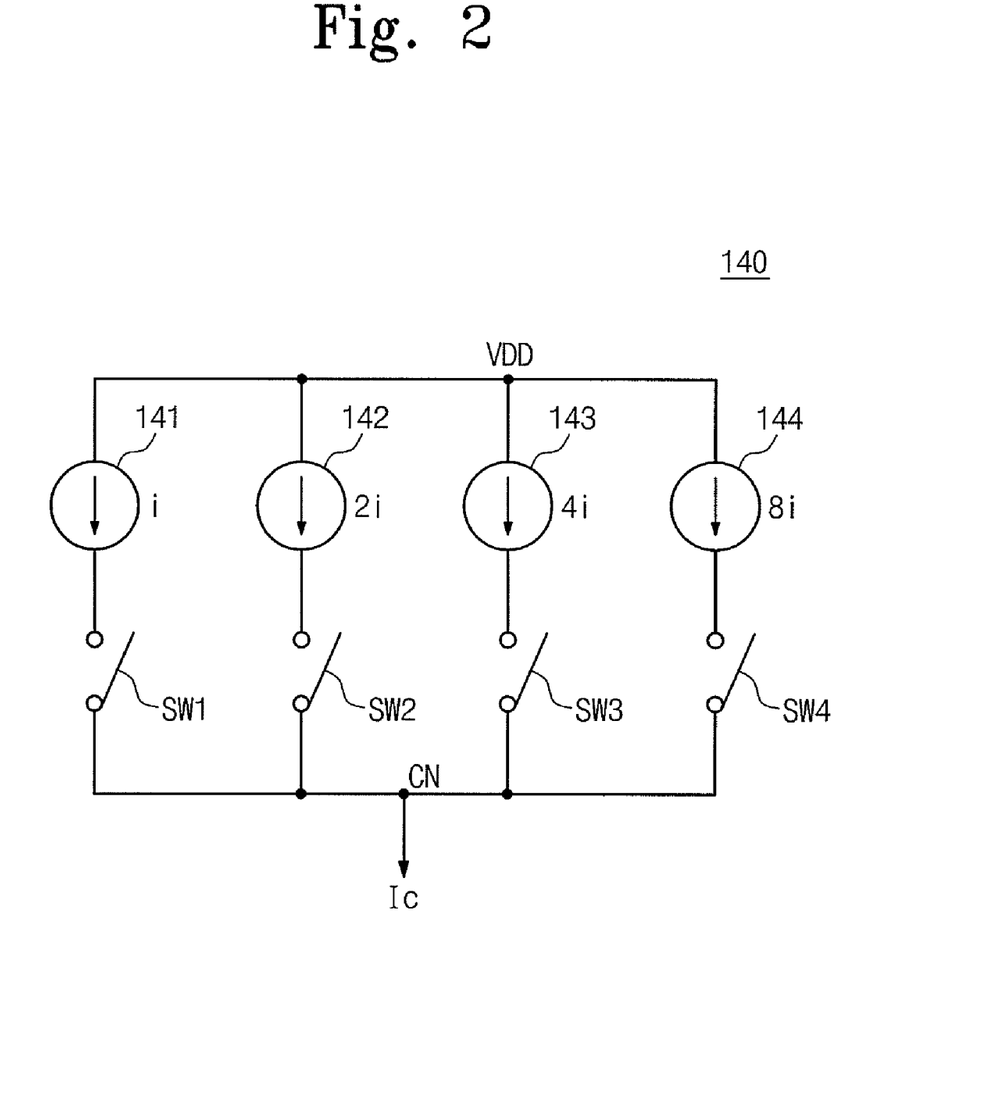
FIG. 2 is a diagram illustrating a current digital-to-analog converter according to an exemplary embodiment of the inventive concept.

FIG. 2 is a diagram illustrating a current D/A converter according to an exemplary embodiment of the inventive concept. The current D/A converter 140 may include four current sources 141, 142, 143, 144, and four switches SW1, SW2, SW3, SW4 which are respectively connected to the current sources 141, 142, 143, 144.

The first current source 141 supplies a unit current i. The second current source 142 supplies a unit current 2i that is two times greater than the unit current i. The third current source 143 supplies a unit current 4i that is four times greater than the unit current i. The fourth current source 144 supplies a unit current 8i that is eight times greater than the unit current i.

The control current Ic that is supplied to the control node CN is determined according to the switching operations of the switches SW1, SW2.

Figure 3:
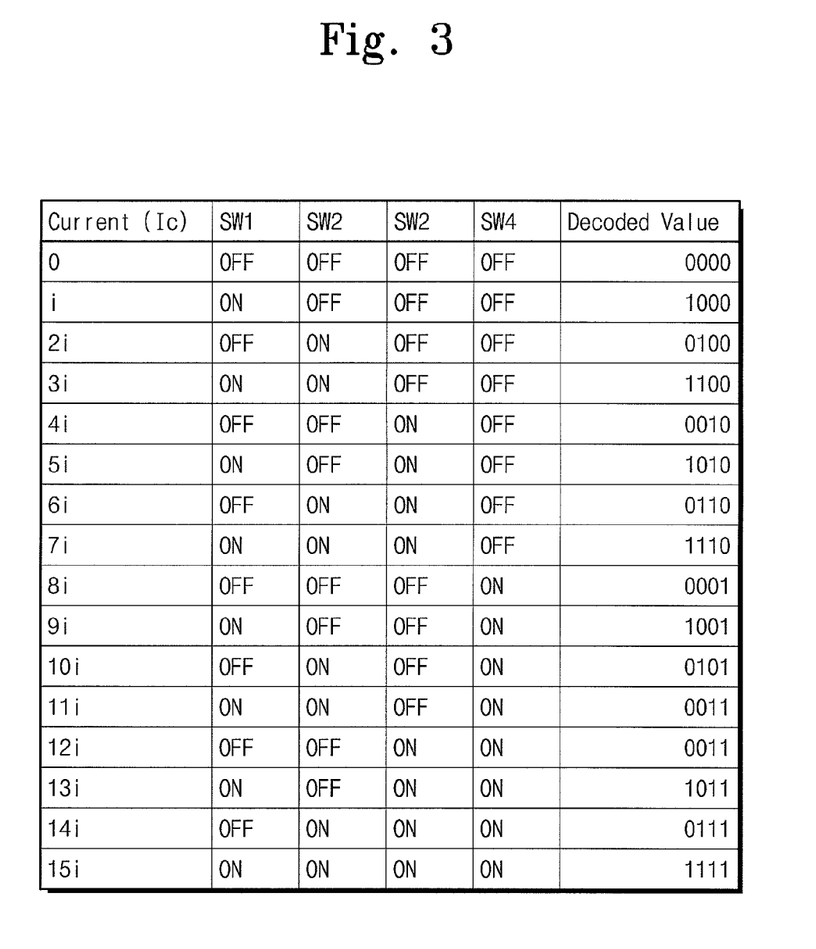
FIG. 3 is a diagram showing decoded values for controlling the switching operation of the current digital-to-analog converter of FIG. 2.

FIG. 3 is a diagram showing decoded values for controlling the switching operation of the current D/A converter of FIG. 2. The switching operations are performed according to decoded values. The control current Ic may supply sixteen different current amounts according to the switching operations.

The decoded value may be selected by a user. As a result, the user may control the offset value of the operational amplifier 120. That is, the user may determine an optimal offset voltage according to elements that are used in the non-inverting amplifier 100. Moreover, the decoded value selected by the user may be stored in a device that implements the non-inverting amplifier 100.

Figure 4:
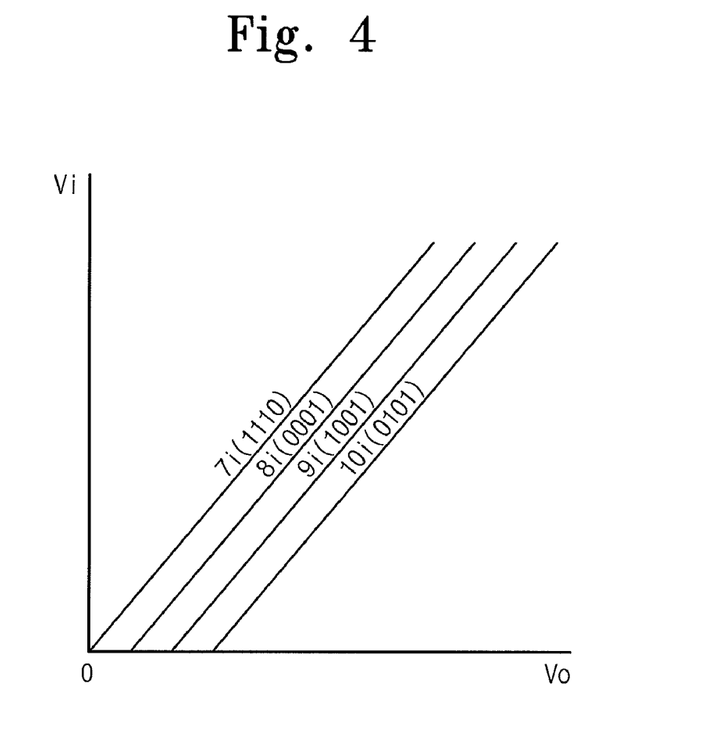
FIG. 4 is a diagram showing the relationship between an input voltage and an output voltage as a function of current supplied to a control node.

FIG. 4 is a diagram showing the relationship between an input voltage Vi and an output voltage Vo dependent upon a current which is supplied to the control node.

Referring to FIG. 4, when the current Ic supplied to the control node CN becomes 7i, the offset voltage becomes substantially 0 V. At this point, a decoded value that is selected for the switching operation of the current D/A converter 140 is '1110'.

A source follower circuit uses a fixed size of MOS transistor for controlling an offset value. Therefore, the offset value is shifted in proportion to the certain drain-source voltage of the MOS transistor. In the source follower circuit, however, decoded values that cannot be used in a bottom level are unnecessarily generated, and the maximum value of a top level is also limited. Herein, the bottom level is the lowest value of an output voltage, and the top level is the highest value of an output value.

However, the non-inverting amplifier 100 controls the current amount by controlling the current D/A converter. As a result, decoded values that cannot be used in the bottom level can be controlled, and the maximum value of the top level is not limited.

Figure 5:
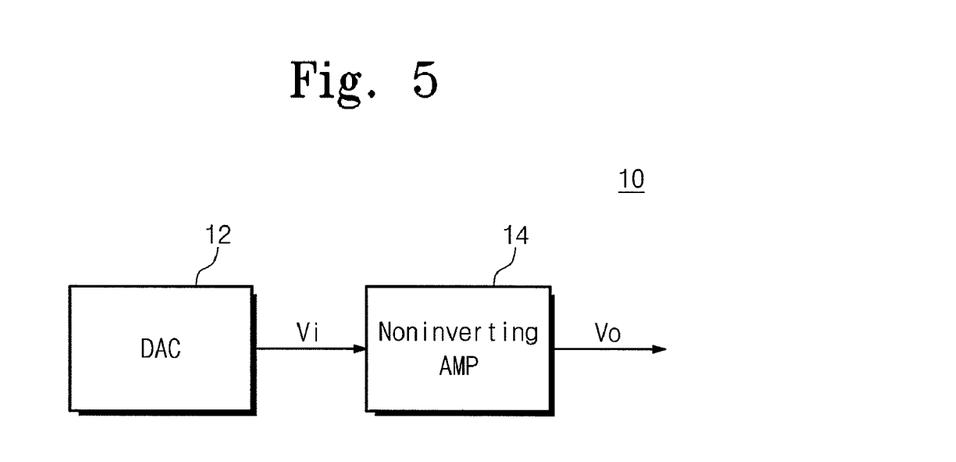
FIG. 5 is a diagram illustrating an exemplary embodiment of a voltage supply circuit which implements the non-inverting amplifier of FIG. 1.

FIG. 5 is a diagram illustrating an exemplary embodiment of a voltage supply circuit which implements the non-inverting amplifier of FIG. 1. A voltage supply circuit 10 may include a D/A converter 12 and a non-inverting amplifier 14.

The D/A converter 12 is a device that generates an analog voltage Vi corresponding to an input digital value. The non-inverting amplifier 14 transfers the analog voltage Vi, which is generated in the D/A converter 12, to an output port. Particularly, the non-inverting amplifier 12 may be implemented by the non-inverting amplifier 100 of FIG. 1.

Figure 6:
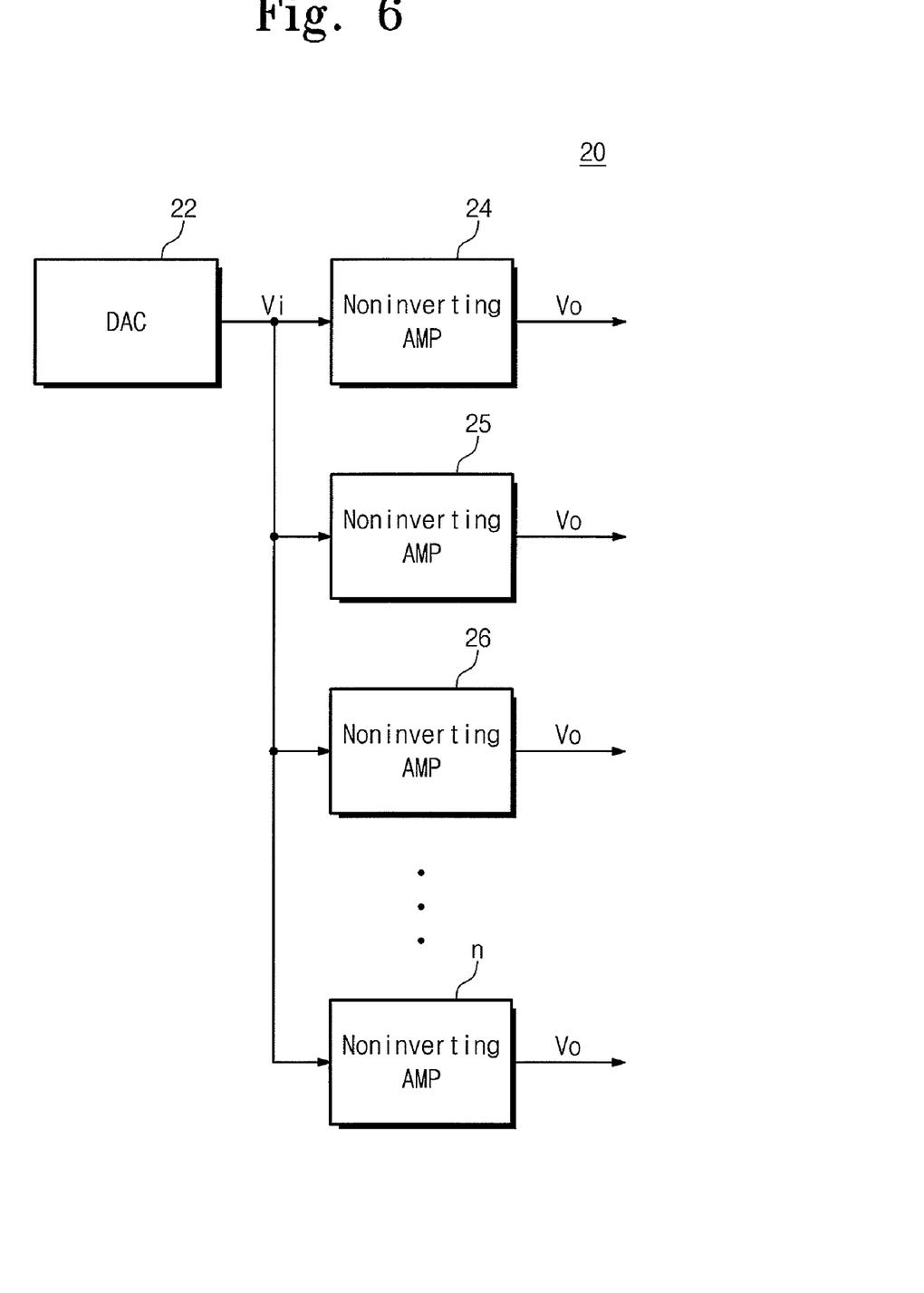
FIG. 6 is a diagram illustrating an exemplary embodiment of a voltage supply circuit which implements the non-inverting amplifier of FIG. 1.

FIG. 6 is a diagram illustrating an exemplary embodiment of a voltage supply circuit which implements the non-inverting amplifiers of FIG. 1. A voltage supply circuit 20 may include one D/A converter 22 and a plurality of non-inverting amplifiers 24, 25, 26, . . . n. Herein, each of the non-inverting amplifiers 24, 25, 26, . . . n may be implemented by the non-inverting amplifier 100 of FIG. 1.

The voltage supply circuit according to exemplary embodiments of the inventive concept may be implemented in various kinds of electronic devices, such as personal computers, Personal Digital Assistants (PDA), mobile phones, digital cameras, camcorders, and the like.

The voltage supply circuit according to exemplary embodiments of the inventive concept may also be applied to optical discs, such as a Compact Disc (CD), a Digital Video Disc (DVD), and the like.

Figure 7:
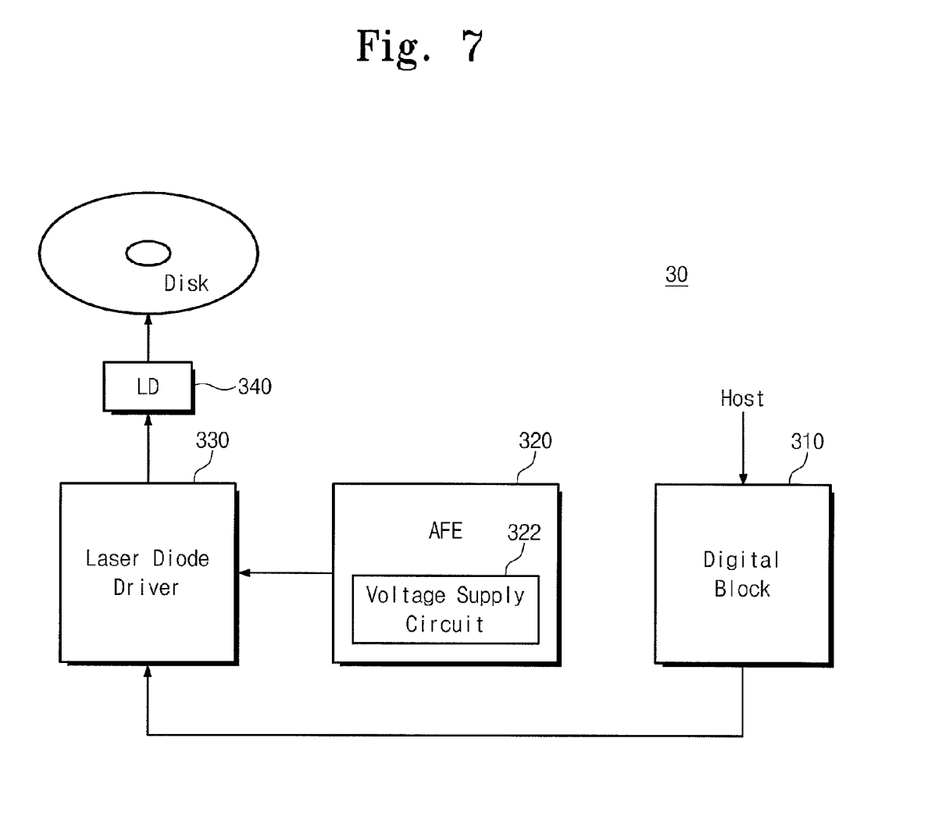
FIG. 7 is a diagram illustrating an exemplary embodiment of an optical disc which implements the non-inverting amplifier of FIG. 1.

FIG. 7 is a diagram illustrating an exemplary embodiment of an optical disc which implements the non-inverting amplifier of FIG. 1. An optical disc system 30 may include a digital block 310, an Analog Front End (AFE) 320, a laser diode driver 330, and a laser diode 340. Herein, the AFE 320 may include a voltage supply circuit 322 which is implemented by a voltage supply circuit 10 of FIG. 5 or a voltage supply circuit 20 of FIG. 6.

The digital block 310 may include an encoder (not shown), a writing strategy block (not shown), and a memory (not shown). Herein, the encoder receives data to be written in a disc, from a host such as a personal computer, and outputs modulated data, using, for example, Eight to Fourteen Modulation (EFM), which is applied to the received data. The writing strategy block outputs at least one writing enable signal by using the modulated data and writing strategy data for a corresponding disc that is stored in the memory.

Writing strategy data is a time parameter that is used to generate at least one writing enable signal. The time parameter denotes information on a time when the writing enable signal is shifted to a logic high level or a logic low level, and is time information that is related between the modulated data and the at least one writing enable signal.

The AFE 320 supplies at least one current source. The AFE 320 may include a voltage supply circuit 322 for supplying at least one voltage.

The laser diode driver 330 controls the laser diode 340 by using at least one writing enable signal that is supplied from the digital block 310 and at least one voltage that is supplied from the AFE 320.

The optical disc 30 according to an exemplary embodiment of the present invention may finely control a very small output voltage through the voltage supply circuit 322.

As described above, the non-inverting amplifier according to exemplary embodiments of the inventive concept supplies a control current to the input resistor or the feedback resistor, controlling the offset voltage. Accordingly, the non-inverting amplifier according to at least one of the exemplary embodiments of the inventive concept can generate the output voltage of substantially 0V.

Moreover, the non-inverting amplifier according to at least one of the exemplary embodiments of the inventive concept can improve linearity.

The above-disclosed subject matter is to be considered illustrative and not restrictive, and the appended claims are intended to cover all such modifications, enhancements, and other exemplary embodiments, which fall within the true spirit and scope of the inventive concept. Thus, the scope of the inventive concept is not to be restricted or limited by the foregoing detailed description.

What is claimed is:

1. A non-inverting amplifier, comprising:
   an operational amplifier that amplifies and outputs a difference between an input voltage and a voltage of a control node;
   an input resistor connected between a reference voltage port and the control node;
   a feedback resistor connected to an output port of the operational amplifier and the control node, and
   a current digital-to-analog converter for supplying a control current to the control node,
   wherein the non-inverting amplifier supplies the control current to the control node for controlling an offset voltage of the output port,
   wherein the current digital-to-analog converter comprises a plurality of current sources connectable in parallel,
   wherein each of the current sources is configured to supply a current to the control node when a switching operation connects a respective current source to the control node,
   wherein each of the current sources are connected in series to a respective switch such that the switching operation controls each of respective switches to supply a desired control current, and
   wherein the switching operation controls each of the respective switches according to a decoded digital value.

2. The non-inverting amplifier of claim 1, wherein the input voltage is transferred to the output port of the operational amplifier.

3. The non-inverting amplifier of claim 1, wherein when the input voltage is substantially 0 V, a voltage of the output port of the operational amplifier becomes substantially 0 V.

4. The non-inverting amplifier of claim 1, wherein the decoded digital value comprises a sequence of digital bits, each digital bit being associated with an on-off condition of each of the respective switches.

5. A non-inverting amplifier, comprising:
   an operational amplifier that amplifies and outputs a difference between an input voltage and a voltage of a control node;
   an input resistor connected between a reference voltage port and the control node;
   a feedback resistor connected to an output port of the operational amplifier and the control node, and
   a current digital-to-analog converter for supplying a control current to the control node,
   wherein the non-inverting amplifier supplies the control current to the control node for controlling an offset voltage of the output port,
   wherein the current digital-to-analog converter comprises a plurality of current sources connectable in parallel,
   wherein each of the current sources is configured to supply a current to the control node when a switching operation connects a respective current source to the control node and
   wherein the plurality of current sources connectable in parallel comprises:
   a first current source that provides a first current amount;
   a second current source that provides twice the first current amount;
   a third current source that provides four times the first current amount; and
   a fourth current source that provides eight times the first current amount.

6. A voltage supply circuit, comprising:
   a digital-to-analog converter that generates an analog voltage according to a digital value; and
   at least one non-inverting amplifier that transfers an output voltage of the digital-to-analog converter,
   wherein the at least one non-inverting amplifier comprises:
   an operational amplifier that amplifies and outputs a difference between an input voltage and a voltage of a control node;
   an input resistor connected between a reference voltage port and the control node; and
   a feedback resistor connected to an output port of the operational amplifier and the control node,
   wherein the at least one non-inverting amplifier supplies a control current to the control node for controlling an offset voltage of the output port, and
   wherein two or more of the non-inverting amplifiers each transfers the output voltage of the digital-to-analog converter and each outputs substantially the same voltage.

7. A voltage supply circuit, comprising:

a digital-to-analog converter that generates an analog voltage according to a digital value; and at least one non-inverting amplifier that transfers an output voltage of the digital-to-analog converter, wherein the at least one non-inverting amplifier comprises:

an operational amplifier that amplifies and outputs a difference between an input voltage and a voltage of a control node;

an input resistor connected between a reference voltage port and the control node; and a feedback resistor connected to an output port of the operational amplifier and the control node, wherein the at least one non-inverting amplifier supplies a control current to the control node for controlling an offset voltage of the output port, and wherein the voltage supply circuit is configured to supply at least one voltage to a laser diode driver that controls a laser diode in a laser power optical disc system.

8. An apparatus for controlling an offset voltage of an operational amplifier having a non-inverting input port, an inverting input port, an output port, a feedback resistor coupled between the output port and the inverting input port, and an input resistor coupled between the inverting port and a reference voltage port, when an input voltage applied to the non-inverting input port of the non-inverting amplifier is substantially 0 V, the apparatus comprising:

a control node coupled to the inverting port; and a plurality of current sources connectable in parallel, wherein each of the current sources is connected in series to a respective switch such that a switching operation controls each of respective switches to supply a desired control current to the control node according to a decoded digital value comprising a sequence of digital bits, each digital bit being associated with an on-off condition of each of respective switches, wherein the at least one non-inverting amplifier supplies a control current to the control node for controlling an offset voltage of the output port.

9. The apparatus of claim 8, wherein each of the plurality of current sources is configured to provide a different current amount.

10. The apparatus of claim 8, wherein a first current source of the plurality of current sources is configured to provide a current amount i, and the sequence of digital bits are arrangeable to provide the desired control current in i incremental current amounts in the range of i to 15i.

* * * * *